United States Patent
Lee

(10) Patent No.: US 12,322,635 B2
(45) Date of Patent: Jun. 3, 2025

(54) DELAMINATION PROCESSES AND FABRICATION OF THIN FILM DEVICES THEREBY

(71) Applicant: Purdue Research Foundation, West Lafayette, IN (US)

(72) Inventor: Chi Hwan Lee, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 769 days.

(21) Appl. No.: 17/613,804

(22) PCT Filed: May 29, 2020

(86) PCT No.: PCT/US2020/035074
§ 371 (c)(1),
(2) Date: Nov. 23, 2021

(87) PCT Pub. No.: WO2020/243396
PCT Pub. Date: Dec. 3, 2020

(65) Prior Publication Data
US 2022/0223457 A1    Jul. 14, 2022

Related U.S. Application Data

(60) Provisional application No. 62/854,421, filed on May 30, 2019, provisional application No. 62/853,756, filed on May 29, 2019.

(51) Int. Cl.
*H01L 21/683* (2006.01)
*B32B 27/06* (2006.01)
(Continued)

(52) U.S. Cl.
CPC .......... *H01L 21/6835* (2013.01); *B32B 27/06* (2013.01); *B32B 37/02* (2013.01);
(Continued)

(58) Field of Classification Search
CPC .................................................. H01L 21/6835
See application file for complete search history.

(56) References Cited

U.S. PATENT DOCUMENTS

| 2003/0162386 A1 | 8/2003 | Ogawa et al. |
| 2014/0091392 A1* | 4/2014 | Takada .............. H01L 21/76256 257/365 |

(Continued)

FOREIGN PATENT DOCUMENTS

KR    101466647    12/2014

OTHER PUBLICATIONS

International Search Report & Written Opinion, for International Application No. PCT/US2020/035074, dated Sep. 18, 2020, 13 pages.

*Primary Examiner* — Ajay Ojha
*Assistant Examiner* — Hajar Kolahdouzan
(74) *Attorney, Agent, or Firm* — Hartman Global IP Law; Gary M. Hartman; Domenica N.S. Hartman

(57) ABSTRACT

Interfacial delamination processes for physically separating a film structure from a substrate, and processes of fabricating a thin-film electronic device. The processes entail providing the substrate with an electrically-conductive separation layer on a surface of the substrate and optionally providing a pin hole free barrier layer on the electrically-conductive separation layer, forming a film structure on the electrically-conductive separation layer or, if present, the barrier layer, to yield a multilayer structure, and separating the film structure from the substrate by subjecting the multilayer structure to interfacial debonding that comprises contacting at least an interface between the film structure and the electrically-conductive separation layer or, if present, the barrier layer, with water or an electrolyte solution.

29 Claims, 4 Drawing Sheets

(51) Int. Cl.
    *B32B 37/02*    (2006.01)
    *B32B 37/18*    (2006.01)
    *B32B 43/00*    (2006.01)
    *H01L 21/56*    (2006.01)

(52) U.S. Cl.
    CPC .......... *B32B 37/182* (2013.01); *B32B 43/006* (2013.01); *H01L 21/568* (2013.01); *B32B 2307/202* (2013.01); *B32B 2307/204* (2013.01); *B32B 2310/021* (2013.01); *B32B 2310/0409* (2013.01); *B32B 2310/0445* (2013.01); *B32B 2457/08* (2013.01); *B32B 2457/10* (2013.01); *H01L 2221/6835* (2013.01); *H01L 2221/68381* (2013.01)

(56) References Cited

U.S. PATENT DOCUMENTS

2014/0162433 A1* 6/2014 Willner .................... B32B 38/10
                                                    156/501
2015/0368112 A1* 12/2015 Na ........................ C01B 32/186
                                                    156/60
2016/0130717 A1* 5/2016 Ye ............................ C25F 7/00
                                                    428/188

* cited by examiner

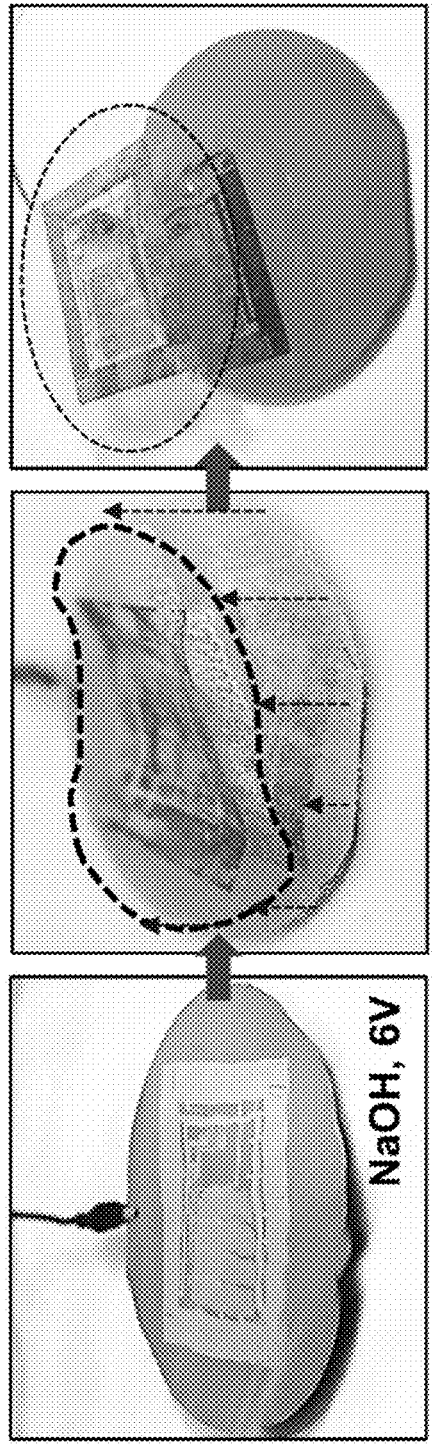
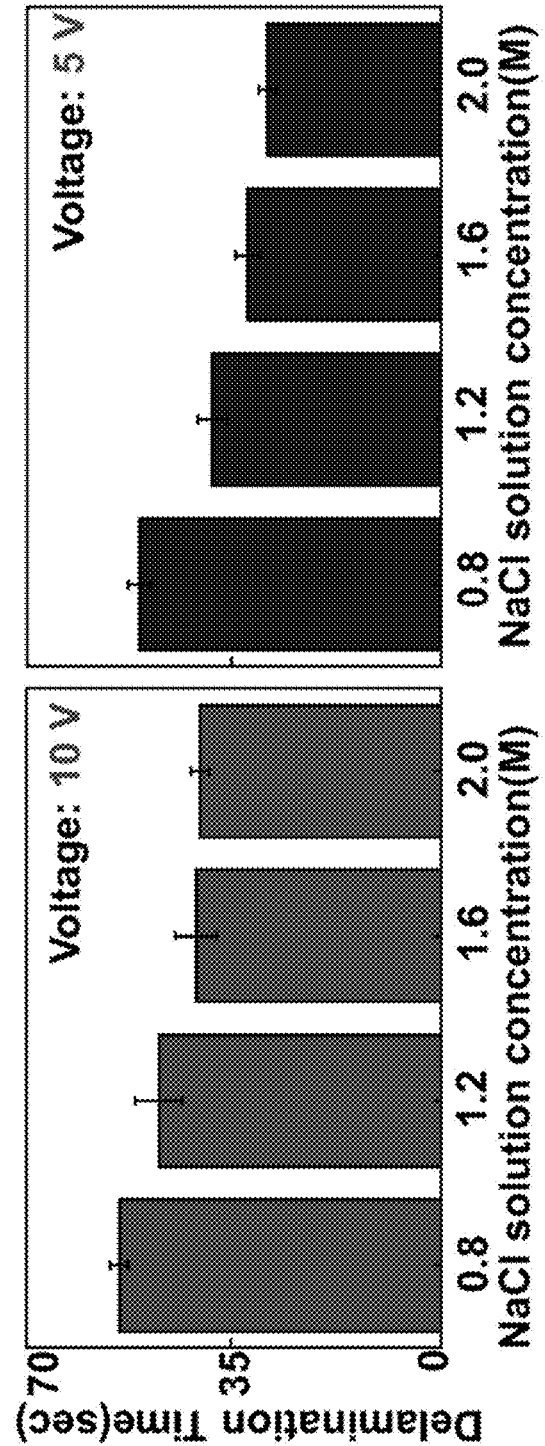

DELAMINATION PROCESSES AND FABRICATION OF THIN FILM DEVICES THEREBY

CROSS-REFERENCE TO RELATED APPLICATIONS

This application claims priority to International Patent Application No. PCT/US2020/035074 filed May 29, 2020, which claims the benefit of U.S. Provisional Application No. 62/853,756 filed May 29, 2019, and U.S. Provisional Application No. 62/854,421 filed May 30, 2019. The contents of these prior patent documents are incorporated herein by reference.

BACKGROUND OF THE INVENTION

The present invention generally relates to processes for delaminating films from substrates. The invention particularly relates to interfacial delamination processes for physically separating a film structure from a substrate, as a nonlimiting example, during the fabrication of thin film devices, including but not limited to thin film batteries.

Thin film devices offer the capability of performances beyond that of traditional bulk devices as a result of being fabricated on a diverse variety of substrates and surfaces, including lightweight, low-cost, transparent, and/or flexible substrates suitable for use in many emerging applications. Examples include flexible complementary metal oxide semiconductor (CMOS) systems, multifunctional sensors and optoelectronics, and high-speed electronic circuits. Thin film devices are conventionally fabricated on a rigid, flat substrate, such as a wafer or glass substrate, by using conventional photolithography methods that are extremely well suited to the task to define complex micro/nano-scale patterns on a rigid, flat substrate. Significant challenges exist in adopting these photolithography methods directly to the fabrication of thin film devices on flexible, stretchable, and/or transparent substrates, as these techniques were principally designed to form micro- and nano-scale patterns on rigid, flat, two-dimensional surfaces formed by radiation-sensitive materials. In addition, these techniques typically involve the use of chemical and thermal treatments that often require additional fabrication steps to protect the constituent materials, which make the entire process even more complicated and time-consuming.

Thin-film batteries offer performances beyond typical bulk rechargeable batteries by having higher average output voltages, lower weights (thus higher energy density), and longer cycling lives. Thin-film batteries are conventionally fabricated on rigid, flat substrates such as silicon wafers and glasses, which can account for more than 25% of the total cost and weight of the batteries. Consequently, broadening the choice of substrates would not only reduce material and fabrication costs, but also potentially endow thin-film batteries with new features, such as flexibility, lightweight, and convenience in installation. However, many desirable flexible substrates, such as polyethylene terephthalate (PET) plastic, have melting temperatures that are inadequate to meet the thermal resistance necessary to accommodate conditions encountered during post-fabrication processes associated with thin film batteries. As such, significant efforts that have been directed to producing flexible thin-film batteries have focused on developing low temperature deposition techniques to accommodate flexible substrate materials. However, such efforts often lead to low quality thin-films and inferior battery performance.

More recently, various transfer printing approaches have been developed that enable active thin-films to be physically transferred from their native growth/fabrication "donor/host" wafers to a "receiver" substrate. The success of a transfer printing approach hinges on how controllably the thin-film can be delaminated from its donor/host substrate. Several different debonding techniques have been developed for this purpose by exploiting laser-assisted liftoff, thermal mechanical peeling, controlled spalling, electrochemical delamination, and ultrasonication-induced microbubble techniques. These techniques have yielded significant achievements over the last decades, but the choice of receiver substrates has remained limited because of the levels of thermal and chemical resistance required by post-fabrication processes. In these schemes, the fabrication wafer is often sacrificed and cannot be recycled. In addition, these approaches typically require the use of expensive and bulky instruments, limiting their applications in site- and time-specific conditions.

As a particular but nonlimiting example, lift-off processes have been used to physically separate gallium arsenide (GaAs) nanomembranes from host substrates, for example, GaAs wafers. Specifically, multiple semiconducting/sacrificial layers are grown epitaxially on a host wafer, followed by immersion in an appropriate etchant solution such as hydrofluoric acid (HF) that can selectively dissolve pre-deposited sacrificial layers such as aluminum gallium arsenide (AlGaAs). The removal of sacrificial layers allows the physical release of the GaAs nanomembranes from the host wafer. Repeated 'pick-and-place' operations in a strict order are employed to deliver the released nanomembranes to the desired locations of a receiver substrate, for example, a flexible polyimide film. Finally, additional post-fabrication processes are performed to complete the desired functional devices, such as thin film photovoltaics on a flexible substrate.

Controlled spalling techniques generate controlled cracks underneath a donor wafer by utilizing thermal mismatch-induced residual stresses. As a particular but nonlimiting example, a relatively thick silver (Ag) layer (greater than >20 µm thick) is deposited on a surface of a donor germanium (Ge) wafer to serve as a stress inducer, followed by annealing at about 900° C. for a few seconds in a belt furnace. During cooling, a large difference in thermal contractions between the Ag layer and the donor Ge wafer leads to controlled stresses below the surface of the wafer that crack a top thick layer of the Ge wafer, for example, a layer of greater than 40 µm in thickness. The depth of the crack can be estimated by the thickness of the Ag stress-inducer layer. Spalling of multiple functional thin-film layers has been used to construct the desired functional devices such as thin-film photovoltaics on a flexible substrate.

The above-noted separation/delamination techniques have enabled the successful fabrication of thin film micro/nano-scale devices on a variety of mechanically flexible substrates, including polyurethane, polyimide and silicone films. However, the choice of receiver substrate remains limited because the substrate must have a certain degree of thermal and chemical resistance to accommodate conditions encountered during post-fabrication processes. In addition, the host/donor wafer must often be sacrificed as they cannot be recycled in these schemes. Transfer printing of thin film micro/nano-scale devices capable of supporting various combinations of semiconducting thin film materials through wafer-scale batch processes has not been explored yet.

U.S. Pat. No. 9,337,169 to Lee et al. discloses the fabrication of electronic, optoelectronic, and magnetic devices and, more particularly, the fabrication of such devices using an environmentally-assisted transfer technique. The device fabrication method includes a controlled interfacial debonding technique that delaminates thin films from a substrate in the presence of water at room temperature. In particular, the method includes providing a growth substrate including an oxide layer, forming a metal layer over the oxide layer, forming a stack of device layers over the metal layer, performing fluid-assisted interfacial debonding of the metal layer to separate the stack of device layers and the metal layer from the growth substrate, and affixing the stack of device layers to a target substrate.

BRIEF SUMMARY OF THE INVENTION

The present invention provides interfacial delamination processes suitable for physically separating a film structure from a substrate, as a nonlimiting example, during the fabrication of a thin film device such as a thin film battery.

According to one aspect, an interfacial delamination process includes providing the substrate with an electrically-conductive separation layer on a surface of the substrate, forming a film structure on the electrically-conductive separation layer to yield a multilayer structure, and then separating the film structure from the electrically-conductive separation layer by subjecting the multilayer structure to microbubble-assisted interfacial debonding that comprises contacting at least an interface between the film structure and the electrically-conductive separation layer with water or an electrolyte solution and applying a voltage between the electrically-conductive separation layer and an anode that is also in contact with the water or electrolyte solution to generate microbubbles at the interface that delaminate and buoy the film structure from the electrically-conductive separation layer.

According to another aspect, a process of fabricating a thin film device includes providing a substrate with an electrically-conductive separation layer on a surface of the substrate, applying and bonding a dielectric polymeric film to the electrically-conductive separation layer of the substrate, forming the thin film device on the dielectric polymeric film to yield a multilayer structure, and then separating the multilayer structure from the electrically-conductive separation layer by subjecting the multilayer structure to microbubble-assisted interfacial debonding that comprises contacting at least an interface between the dielectric polymeric film and the electrically-conductive separation layer with water or an electrolyte solution and applying a voltage between the electrically-conductive separation layer and an anode that is also in contact with the water or electrolyte solution to generate microbubbles at the interface that delaminate and buoy the multilayer structure from the electrically-conductive separation layer.

According to yet another aspect, an interfacial delamination process includes providing a substrate with an electrically-conductive separation layer on a surface of the substrate and a pin-hole free barrier layer on the electrically-conductive separation layer, forming a film structure on the barrier layer to yield a multilayer structure, and separating the film structure from the barrier layer by subjecting the multilayer structure to interfacial debonding that comprises contacting at least an interface between the film structure and the barrier layer with water or an electrolyte solution.

Technical aspects of the processes described above preferably include the ability to fabricate thin film devices on and then transfer the devices to a wide variety of substrates, including mechanically flexible thin film substrates, using a transfer printing method that can be versatile and scalable and also enable physical separation of a prefabricated thin-film device from its original fabrication (host or donor) substrate without performance degradation. In addition, a host/donor substrate on which the device is fabricated can be recycled and reused to fabricate additional devices. The processes are also amenable to wafer-scale batch processes.

Other aspects and advantages of this invention will be appreciated from the following detailed description.

BRIEF DESCRIPTION OF THE SEVERAL VIEWS OF THE DRAWING

FIGS. 3, 4, and 5 contain three images representing the delamination of a thin film device from a rigid, flat donor/host/fabrication substrate in accordance with nonlimiting aspects of this invention.

FIGS. 6 and 7 are two graphs evidencing the effect of electrolyte concentration and applied voltage on time to delaminate a polyimide film from a donor Si wafer coated with a metal film, such as an Au film.

FIG. 11 contains ECG data relating to the performances of the thin film electrophysiological sensing electrode (lefthand graph) and a commercial ECG electrode (righthand graph), and FIG. 12 contains EMG data relating to the performances of the thin film electrophysiological sensing electrode (lefthand graph) and a commercial EMG electrode (righthand graph).

DETAILED DESCRIPTION OF THE INVENTION

The following describes interfacial delamination processes that enable the fabrication of thin film devices on a wide variety of surfaces and substrates of interest. The delamination processes are generated by electrochemical reactions at the interface between a pre-fabricated thin film device and a donor/host substrate on which the device was fabricated. The processes can be controlled to facilitate intact separation of relatively large thin film devices from donor/host substrates without the need to use mechanical peeling tools or equipment. The devices may then be transferred to flexible, stretchable, and/or transparent substrates, and yield flexible, stretchable, and/or transparent thin film devices.

The delamination processes further enable the physical separation of prefabricated thin film devices from a host/donor substrate (e.g., a semiconductor wafer or glass substrate) to enable wafer-scale, defect-free delamination of multiple-stacked thin film devices, and enable the host/donor substrate to be reused multiple times as a host/donor substrate for subsequent device fabrication to yield significant cost-savings to device fabrication. During investigations leading to the invention, high performance thin film devices, including resistors, diodes, and transistors that incorporate monocrystalline doped Si membranes, were intactly delaminated from fabrication host/donor substrate s of over 4 inches (about 10 cm) in size and then printed on a variety of diverse substrates. This aspect enables a wide range of applications in the construction of many electronic devices, such as optoelectronics (including plasmonic devices), integrated circuits, and biosensors, on a variety of desirable substrates and surfaces. Other devices of particular interest include thin film batteries, though it should be understood that the processes are more generally applicable to a wide range of thin film devices, such as optoelectronics (including plasmonic devices), integrated circuits, and biosensors, and their transfer to a variety of different substrates and surfaces.

Figures 1, 2:
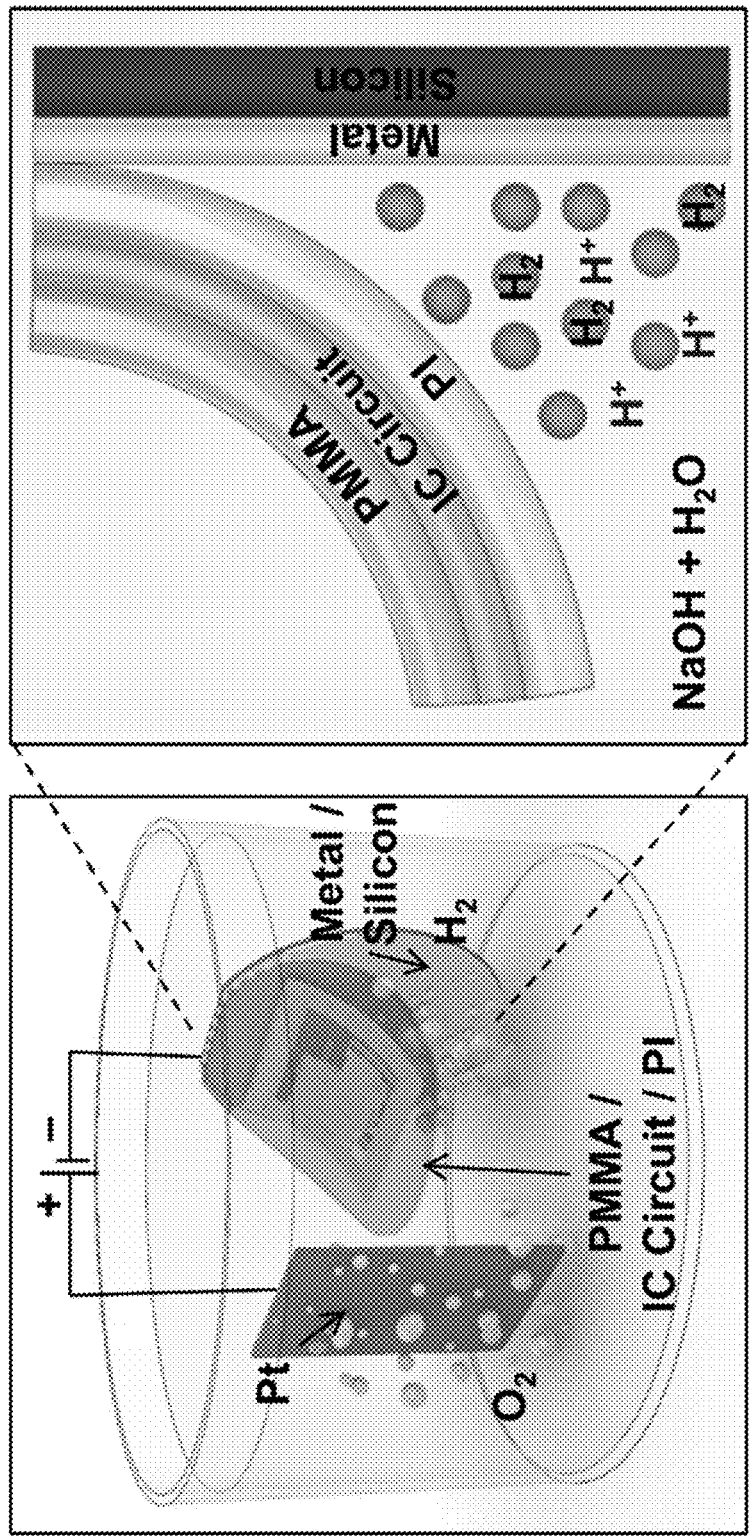
FIG. 1 schematically illustrates an interfacial delamination process in which a film structure is debonded from an electrically-conductive separation layer in accordance with a nonlimiting embodiment of this invention.
FIG. 2 is a detail of FIG. 1 schematically representing microscale bubbles generated at an interface between the film structure and the electrically-conductive separation layer to debond the film structure and produce a mild buoyancy force capable of completely separating the film structure from a donor/host substrate in accordance with a nonlimiting aspect of this invention.

FIG. 1 shows a schematic illustration of an interfacial delamination process that utilizes a microbubble-assisted interfacial debonding mechanism. In the nonlimiting example shown, a thin polyimide film (PI, e.g., about 1 to about 2 μm thick) has been spin-coated on an electrically-conductive (e.g., metal or doped silicon) separation layer (e.g., about 50 nm thick gold (Au) layer) on a substrate (silicon (Si) wafer) as a flexible support and dielectric layer for a thin film device that has been fabricated on the PI film, for example, using standard semiconductor micro/nano-fabrication processes. The entire multilayer structure has been completely encapsulated with polymethyl methacrylate (PMMA, e.g., about 1 μm thick) to avoid any potential degradation of the device during the subsequent electrochemical reaction process. The multilayer structure is represented in FIG. 1 as having been entirely immersed in an electrolyte solution, in this nonlimiting case either a sodium chloride (NaCl) or sodium hydroxide (NaOH) electrolyte solution. Prior to immersion, an edge of the substrate has been trimmed to expose the multilayer structure in order to provide direct contact between the electrolyte solution and the interface between the PI film and the electrically-conductive separation layer. FIG. 1 depicts a platinum (Pt) plate as also immersed in the electrolyte solution, and a voltage has been applied to the Pt plate (anode) and separation layer (cathode) to produce the following electrochemical reactions:

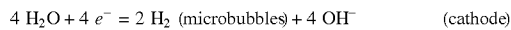
$$4\ H_2O + 4\ e^- = 2\ H_2\ (\text{microbubbles}) + 4\ OH^- \quad (\text{cathode})$$

$$2\ H_2O - 4\ e^- = O_2 + 4\ H^+ \quad (\text{anode})$$

A more detailed side view schematically illustrated in FIG. 2 depicts microscale bubbles ($H_2$) generated at the separation layer (cathode), which produce a mild buoyancy force that is believed to overcome interfacial adhesion between the PI film and the separation layer and facilitate their complete interfacial separation at wafer-scale without the thin film device carried by the PI film suffering from any damage, cracks, etc.

As a nonlimiting example, a pre-prepared specimen was fabricated to contain a thin film device on a 2 μm-thick PI film applied to an Au-coated 4-inch silicon (Au/Si) wafer and encapsulated by 1 μm-thick PMMA. The specimen was immersed in an aqueous NaCl electrolyte solution along with a Pt anode, and a positive potential (about 6V) was applied to the Au layer. FIGS. 3, 4, and 5 show a series of optical images of the specimen during the delamination process. As a result, the thin film device delaminated from the Au/Si wafer and floated to the surface of the electrolyte solution, where it was possible to remove the device and transfer it to another substrate or surface. The donor Au/Si wafer remained intact and reusable for another fabrication process. The investigation evidenced the ability to eliminate the need of any mechanical peeling tools or equipment, such as 90-degree mechanical peeling tools that are commonly used in conventional interfacial debonding methods.

The debonding mechanism represented in FIGS. 1 and 2 can be controlled by controlling the applied voltage and selecting the molar concentration with the electrolyte solution to promote the ability to successfully achieve defect-free delaminations. FIGS. 6 and 7 show delamination time as a function of NaCl concentration using a testbed specimen (2×2 cm$^2$) of 2 μm thick-PI film on a donor Au/Si wafer. The results indicated that the delamination process was accelerated with increasing concentrations of the NaCl solution until the electrochemical reaction became supersaturated (in turn, the delamination time is saturated) when the NaCl molar concentration becomes greater than 2M. FIGS. 6 and 7 also evidence that the average delamination rate increased as the applied voltage was increased from 5V to 10V while maintaining a constant concentration of the NaCl electrolyte solution. It was noted that, based on delamination times, applied voltage appeared to be relatively less influential than the electrolyte concentration. Depending on the construction and materials used to fabricate a particular electronic device, voltages of up to about 10 volts, preferably in a range of about 5 to about 10 volts, could foreseeably be used.

As an alternative to the delamination process described above and depicted in FIGS. 1 and 2, it is foreseeable that delamination of a thin film device from a fabrication (donor or host) substrate, for example, as represented in FIGS. 1 and 2, could be achieved with the interfacial debonding technique described in U.S. Pat. No. 9,337,169 to Lee et al., whose contents are incorporated herein by reference. In this case, the thin film device represented in FIGS. 1 and 3 is delaminated from the substrate by delaminating the support layer from the barrier layer in the presence of water at room temperature using a fluid-assisted interfacial debonding technique that generates electrochemical reactions at the interface between the support layer of device and the separation and barrier layers of the substrate on which the device was fabricated. As with the process depicted in FIGS. 1 and 2, the electrically-conductive separation layer remains adhered to the substrate.

Figures 8, 9, 10:
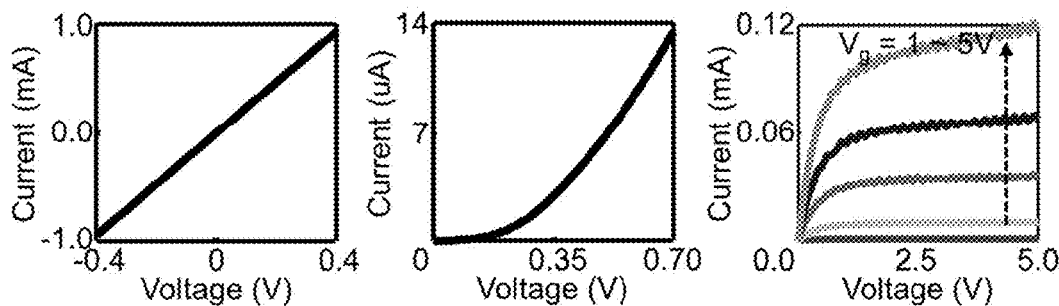
FIGS. 8, 9, and 10 are graphs plotting the measured current-voltage (I-V) curves of, respectively, a representative resistor, diode, and transistor embedded in thin film devices and evidencing that no significant degradation occurred in the electronic performances of the devices after delamination.

Further investigations resulted in various other specimen devices being successfully delaminated, floated on the surface of water, and transferred on diverse non-conventional substrates, including fabric, a leaf, and an artificial hand. The devices were ultra-thin and sufficiently flexible to deform over a human hair. FIGS. 8, 9, and 10 show the measured current-voltage (I-V) curves of a representative resistor, diode, and transistor embedded in some of specimen devices. These results confirmed that no significant degradations occurred in the electronic performances of the circuit components after the delamination process.

Figure 11:
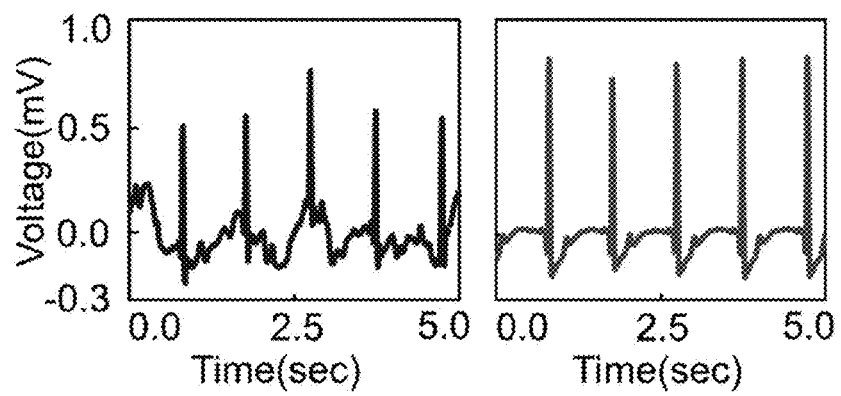
FIGS. 11 and 12 contain graphs relating to the performances of a thin film electrophysiological sensing electrode that was delaminated and applied to elastic substrates (lefthand graphs) and commercial electrodes (righthand graphs).
Figure 12:
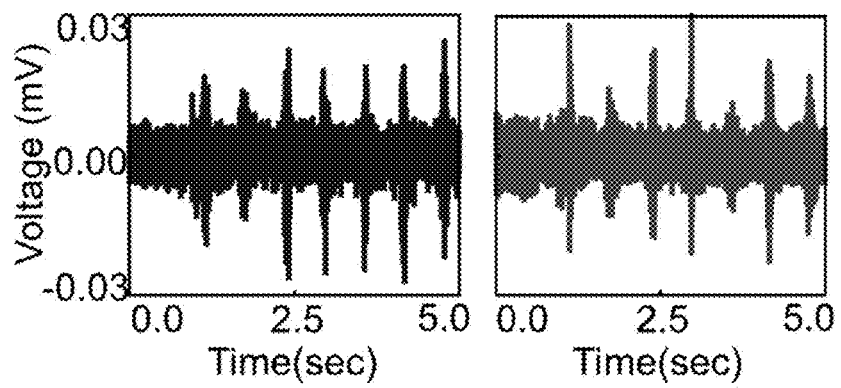

As further examples, FIGS. 11 and 12 contain graphs relating to electrophysiological sensing electrodes that were delaminated and applied to elastic substrates. These devices contained thin layers of PI film (about 1.5 μm) and Au (about 100 nm) patterned to form filamentary serpentine meshes that served as measurement, ground and reference electrodes and connecting leads. The devices were initially fabricated on a donor Au/Si wafer, and then delaminated by using the delamination process described herein. The electrodes were coupled to the skin of a human volunteer to measure electrocardiogram (ECG) and electromyogram (EMG) signals from the chest and forearm areas of the volunteer, respectively. The resulting ECG data (FIG. 11) and EMG data (FIG. 12) obtained from the devices (lefthand graphs in FIGS. 11 and 12) were qualitatively comparable to those recorded with commercial ECG and EMG electrodes (righthand graphs in FIGS. 11 and 12).

Figure 13:
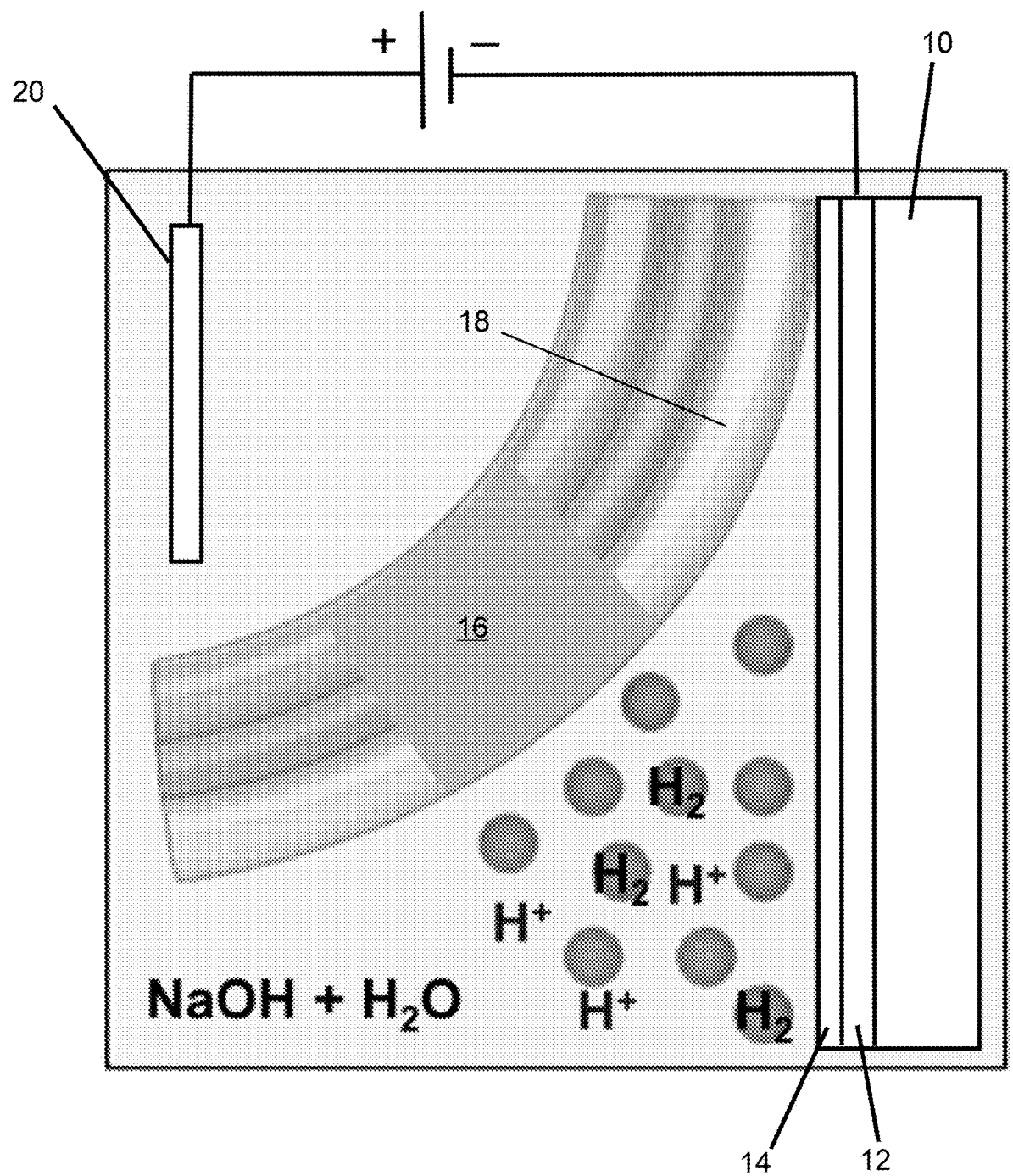
FIG. 13 schematically illustrates an interfacial delamination process wherein microscale bubbles are generated at an interface between a thin film battery and a multilayer stack to debond the thin film battery and produce a mild buoyancy force capable of completely separating the thin film battery from a donor/host substrate in accordance with a nonlimiting aspect of this invention.

FIG. 13 shows a schematic representation of another interfacial delamination process that involves a microbubble-assisted interfacial debonding mechanism in accordance with another nonlimiting aspect of the invention. In the example shown, a barrier layer 14 has been formed on an electrically-conductive (e.g., metal or doped silicon) separation layer 12 deposited on a substrate 10 (e.g., a semiconductor wafer or glass substrate), and a thin film battery 16 has been fabricated in any manner suitable for the intended construction and application for the battery 16. The separation layer 12 is preferably formed of a ductile metal, for example, a single metal or metal alloy, including nickel, copper, aluminum, gold, or another metal or metal alloy having a percentage elongation at break of at least about 8%. The barrier layer 14 is a pinhole-free layer, as nonlimiting examples, a layer of aluminum oxide, hafnium oxide, silicon nitride, or silicon dioxide that has been deposited on top of the separation layer 12 by atomic layer deposition (ALD), plasma-enhanced chemical vapor deposition (PECVD), or an equivalent process capable of depositing a pinhole-free layer on the separation layer 12. The battery 16 is schematically represented as comprising multiple layers, one of which preferably serves as a flexible dielectric support layer 18 that initially overlies and contacts the barrier layer 14. A nonlimiting example of a suitable support layer 18 is polyethylene terephthalate (PET). The entire battery structure may be completely encapsulated with a removable polymer (not shown), a nonlimiting example being polymethyl methacrylate (PMMA, e.g., about 1 μm thick), to avoid any potential degradation of the battery during the subsequent delamination process.

The battery 16 and its support structure (substrate 10, separation layer 12, and barrier layer 14) are represented in FIG. 13 as having been entirely immersed in an electrolyte solution, in this case a sodium hydroxide (NaOH) electrolyte solution, though the use of sodium chloride (NaCl) and other electrolyte solutions is foreseeable. Prior to immersion, an edge of the substrate 10 may be trimmed to expose at least the support layer 18 of the battery 16 and the separation and barrier layers 12 and 14 on the substrate 10 in order to provide direct contact between the electrolyte solution and the interface between the support layer 18 and the barrier layer 14. An anode 20 is also represented as being immersed in the electrolyte solution, after which a voltage is applied to the anode 20 and separation layer (cathode) 12 to produce the following electrochemical reactions:

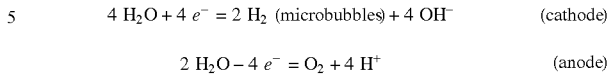

$$4\ H_2O + 4\ e^- = 2\ H_2\ (\text{microbubbles}) + 4\ OH^- \quad \text{(cathode)}$$

$$2\ H_2O - 4\ e^- = O_2 + 4\ H^+ \quad \text{(anode)}$$

FIG. 13 depicts microscale hydrogen gas ($H_2$) bubbles generated at the separation layer (cathode) 12, which produce a mild buoyancy force that is believed to overcome interfacial adhesion between the support layer 18 and barrier layer 14 and facilitate their complete interfacial separation at wafer-scale without the battery 16 carried by the support layer 18 suffering from any damage, cracks, etc. As such, the delamination process serves to delaminate the thin film battery 16 from its fabrication (donor or host) substrate 10 in a defect-free manner, and allows the substrate 10 to be reused in subsequent manufacturing cycles. Following delamination, the thin-film battery 16 may be bonded to nearly any kind of receiver substrate, including but not limited to a flexible polymeric substrate, enabling the target surface of the receiver substrate to serve as a desired power source.

The physical delamination of the battery 16 from the substrate 10 and its separation and barrier layers 12 and 14 can be performed at room temperature, and is fundamentally driven by the physical and chemical separation of atoms and molecules at the barrier-support layer interface in a manipulated environment, wherein the nucleation location and propagation direction of the debonding process can be controllably triggered and mediated. The debonding mechanism can be controlled in part by controlling the applied voltage and selecting the molar concentration with the electrolyte solution to promote the ability to successfully achieve defect-free delaminations. As noted above in reference to FIGS. 6 and 7, investigations performed with other thin film devices indicate that the delamination time of the battery 16 is a function of the electrolyte concentration, wherein delamination is accelerated with increasing concentration until the electrochemical reaction becomes supersaturated (in turn, the delamination time is saturated), and the delamination rate also increases as the applied voltage increases, though to a less pronounced extent.

Conventional fabrication processes for high performance thin film batteries and other thin film devices often require high-temperature processes or deposition techniques. Particularly at high temperatures, for example about 550° C. and higher, such processes and deposition techniques could deform or change the crystallinity of the separation layer 12, leading to an increased interfacial adhesion between the separation layer 12 and the thin film battery 16. As a result, the battery 16 might not cleanly delaminate from the separation layer 12. As a solution, the pin-hole free barrier layer 14 is preferably included in the layer stack on the substrate 10, and in particular is deposited on top of the separation layer 12 by atomic layer deposition (ALD), plasma-enhanced chemical vapor deposition (PECVD), or an equivalent. As used herein, "pin-hole free" refers to the barrier layer 14 having through-thickness porosity having a maximum cross-sectional dimension of not greater than 10 nm. To avoid recrystallization or physical deformation of the separation layer 12, the barrier layer 14 is preferably at least about 3 nm thick, for example, about 5 to about 10 nm thick. This aspect is especially desirable when the required product quality (device performance) is high, in which case high temperature processes are required for the thin film devices.

As an alternative to the delamination process described above and depicted in FIG. 13, it is foreseeable that delamination of a thin film battery (or other device) from a fabrication (donor or host) substrate, for example, as represented in FIG. 13, could be achieved with the interfacial debonding technique described in U.S. Pat. No. 9,337,169 to Lee et al., whose contents are incorporated herein by reference. In this case, the thin film battery 16 represented in FIG. 13 is delaminated from the substrate 10 by delaminating the support layer 18 from the barrier layer 14 in the presence of water at room temperature using a fluid-assisted interfacial debonding technique that generates electrochemical reactions at the interface between the support layer 18 of the battery 16 (or other device) and the separation and barrier layers 12 and 14 of the substrate 10 on which the battery 16 was fabricated. As with the process depicted in FIG. 13, the electrically-conductive separation layer 12 remains adhered to the substrate 10.

The delamination processes described above provide simple, low-cost, versatile and scalable transfer printing methods by using water or an electrolyte solution at room temperature, and therefore at lower temperatures that occur during existing debonding techniques, such as those that exploit laser-assisted liftoff, thermal mechanical peeling, controlled spalling, electrochemical delamination, and ultrasonication-induced microbubbles.

While the invention has been described in terms of particular embodiments and investigations, it should be apparent that alternatives could be adopted by one skilled in the art. For example, devices produced by the processes could differ in appearance and construction from the embodiments described herein and shown in the drawings, process parameters could be modified, and appropriate materials could be substituted for those noted. As such, it should be understood that the above detailed description is intended to describe the particular embodiments represented in the drawings and certain but not necessarily all features and aspects thereof, and to identify certain but not necessarily all alternatives to the represented embodiments and their described features and aspects. As a nonlimiting example, the invention encompasses additional or alternative embodiments in which one or more features or aspects of a particular embodiment could be eliminated, or two or more features or aspects of different embodiments could be combined. Accordingly, it should be understood that the invention is not necessarily limited to any embodiment described herein or illustrated in the drawings, and the phraseology and terminology employed above are for the purpose of describing the illustrated embodiments and investigations and do not necessarily serve as limitations to the scope of the invention. Therefore, the scope of the invention is to be limited only by the following claims.

The invention claimed is:

1. An interfacial delamination process for physically separating a film structure from a substrate, the process comprising:
    providing the substrate with an electrically-conductive separation layer on a surface of the substrate;
    forming a film structure on the electrically-conductive separation layer to yield a multilayer structure, wherein the film structure comprises a flexible dielectric polymeric film disposed on and bonded to the electrically-conductive separation layer of the substrate and flexible electronic circuitry disposed on the flexible dielectric polymeric film; and
    separating the film structure from the electrically-conductive separation layer by subjecting the multilayer structure to microbubble assisted interfacial debonding that comprises contacting at least an interface between the flexible dielectric polymeric film of the film structure and the electrically-conductive separation layer with an electrolyte solution and applying a voltage between the electrically-conductive separation layer and an anode that is also in contact with the electrolyte solution to generate microbubbles at the interface that debond the flexible dielectric polymeric film from the electrically-conductive separation layer and delaminate and buoy the film structure from the electrically-conductive separation layer.

2. The process according to claim 1, wherein the film structure is a thin film device chosen from the group consisting of optoelectronic, integrated circuit, and biosensor devices.

3. The process according to claim 1, the process further comprising bonding the film structure to a second substrate.

4. The process according to claim 1, wherein the microbubbles are hydrogen gas bubbles.

5. The process according to claim 4, wherein the interface between the film structure and the electrically-conductive separation layer is contacted with the electrolyte solution, and wherein the electrolyte solution is at least saturated with one or more electrolytes.

6. The process according to claim 4, wherein the electrolyte solution has a molar concentration of up to about 2M of sodium chloride or sodium hydroxide.

7. The process according to claim 1, wherein the electrically-conductive separation layer remains adhered to the surface of the substrate after the separating step.

8. The process according to claim 7, wherein after the separating step the process further comprises forming a second film structure on the electrically-conductive separation layer of the substrate to yield a second multilayer structure.

9. The process according to claim 1, wherein the film structure floats to a surface of the electrolyte solution after the separating step.

10. The process according to claim 1, further comprising completely encapsulating the multilayer structure with a polymeric material and then exposing the interface through the polymeric material prior to the separating step.

11. A process of fabricating a thin-film device, the process comprising:
    providing a substrate with an electrically-conductive separation layer on a surface of the substrate;
    applying and bonding a flexible dielectric polymeric film to the electrically-conductive separation layer of the substrate;
    forming the thin film device comprising flexible electronic circuitry on the flexible dielectric polymeric film to yield a multilayer structure; and
    separating the multilayer structure from the electrically-conductive separation layer by subjecting the multilayer structure to microbubble assisted interfacial debonding that comprises contacting at least an interface between the flexible dielectric polymeric film and the electrically-conductive separation layer with water or an electrolyte solution and applying a voltage between the electrically-conductive separation layer and an anode that is also in contact with the water or electrolyte solution to generate microbubbles at the interface that delaminate and buoy the multilayer structure from the electrically-conductive separation layer.

12. The process according to claim 11, wherein the thin film device is chosen from the group consisting of optoelectronic, integrated circuit, and biosensor devices.

13. The process according to claim 11, the process further comprising bonding the multilayer structure to a second substrate.

14. The process according to claim 11, wherein the microbubbles are hydrogen gas bubbles.

15. The process according to claim 14, wherein the interface between the multilayer structure and the electrically-conductive separation layer is contacted with the electrolyte solution.

16. The process according to claim 11, wherein the electrically-conductive separation layer remains adhered to the surface of the substrate after the separating step.

17. The process according to claim 16, wherein after the separating step the process further comprises forming a second dielectric polymeric film on the electrically-conductive separation layer of the substrate and a second thin-film electronic device on the second dielectric polymeric film to yield a second multilayer structure.

18. The process according to claim 11, wherein the multilayer structure floats to a surface of the water or electrolyte solution after the separating step.

19. The process according to claim 11, further comprising encapsulating the multilayer structure with a protective layer of polymethyl methacrylate and then exposing the interface through the polymeric material prior to the separating step.

20. An interfacial delamination process for physically separating a film structure from a substrate, the process comprising:
    providing the substrate with an electrically-conductive separation layer on a surface of the substrate and a pin hole free barrier layer on the electrically-conductive separation layer;
    forming a film structure on the barrier layer to yield a multilayer structure, the film structure comprising a flexible dielectric polymeric film disposed on and bonded to the pin hole free barrier layer and flexible electronic circuitry disposed on the flexible dielectric polymeric film; and
    separating the film structure from the barrier layer by subjecting the multilayer structure to interfacial debonding that comprises contacting at least an interface between the flexible dielectric polymeric film of the film structure and the barrier layer with water or an electrolyte solution.

21. The process according to claim 20, wherein the interface between the film structure and the barrier layer is contacted with the electrolyte solution, the process further comprising applying a voltage between the electrically-conductive separation layer and an anode that is also in contact with the electrolyte solution to generate microbubbles at the interface that delaminate and buoy the film structure from the electrically-conductive separation layer.

22. The process according to claim 21, wherein the microbubbles are hydrogen gas bubbles.

23. The process according to claim 21, wherein the electrolyte solution is chosen from the group consisting of a sodium chloride electrolyte solution and a sodium hydroxide electrolyte solution.

24. The process according to claim 21, wherein the barrier layer is formed of aluminum oxide, hafnium oxide, silicon nitride, or silicon dioxide.

25. The process according to claim 20, wherein the interface between the film structure and the barrier layer is contacted with water.

26. The process according to claim 20, wherein the electrically-conductive separation layer remains adhered to the surface of the substrate after the separating step.

27. The process according to claim 26, wherein after the separating step the process further comprises forming a second film structure on the electrically-conductive separation layer of the substrate to yield a second multilayer structure.

28. The process according to claim 20, wherein the film structure is a thin film battery.

29. The process according to claim 20, the process further comprising bonding the film structure to a second substrate.

* * * * *